(12) United States Patent
Hwang et al.

(10) Patent No.: US 6,750,643 B2
(45) Date of Patent: Jun. 15, 2004

(54) GROUP WIRING PATCHING SYSTEM AND METHOD FOR WIRE PAIR IDENTIFICATION

(76) Inventors: Richard Hwang, Nei-Hu P.O.Box 6-105, Taipei (TW); Wayne Hwang, P.O. Box 8242, Goleta, CA (US) 93118; Memiee L. Hwang, P.O. Box 8242, Goleta, CA (US) 93118

( * ) Notice: Subject to any disclaimer, the term of this patent is extended or adjusted under 35 U.S.C. 154(b) by 3 days.

(21) Appl. No.: 10/211,330

(22) Filed: Aug. 5, 2002

(65) Prior Publication Data

US 2004/0021452 A1 Feb. 5, 2004

(51) Int. Cl.[7] .......................... G01R 19/00; H04M 1/24; H04M 3/08
(52) U.S. Cl. .......................... 324/66; 379/9; 379/15.01; 379/25; 379/29.01
(58) Field of Search ..................... 379/9, 15.01, 25, 379/29.01; 324/66, 538, 539, 542, 158.1

(56) References Cited

U.S. PATENT DOCUMENTS

| | | | | |
|---|---|---|---|---|
| 4,575,588 A | * | 3/1986 | Vande Vyver | ................. 379/22 |
| 5,847,557 A | * | 12/1998 | Fincher et al. | ................. 324/66 |
| 6,039,732 A | * | 3/2000 | Ichikawa et al. | ............. 606/38 |

* cited by examiner

*Primary Examiner*—Vincent Nguyen
(74) *Attorney, Agent, or Firm*—Troxell Law Office PLLC

(57) ABSTRACT

A group wiring patching device which has built-in light emitting device and filtering device coupled with wire pair receptacle thereof. When a testing voltage is applied to the circuit of the light emitting device, the light emitting device will emit light for assisting wire pair identification. The filtering device can minimize or even eliminate loop back shorting resulted by the circuit of the connected light emitting when communication signals or low voltage signals being applied thereto. Therefore, the group wiring patching device of the present invention will be able to perform ordinary signal transmitting functions without the need to remove the light emitting device after the wire pair identification process is done.

11 Claims, 9 Drawing Sheets

GROUP WIRING PATCHING SYSTEM AND METHOD FOR WIRE PAIR IDENTIFICATION

FIELD OF THE INVENTION

This invention relates to sorting electrical conductors, particularly to an improved group wiring patching device such like a patch panel which can be used with a voltage supplier for wire pair identification.

BACKGROUND OF THE INVENTION

It is often necessary to identify individual wires or circuits which extend between two locations. Please refer to FIG. 1. For example, a typical communication system such as internet service provider system, local area network (LAN) system, wide area network (WAN) system, metropolitan area network (MAN) system, intranet networking system, or telephone work center usually involves in hundreds or even thousands of end users located at different sites or places sharing the service (or controlled by) provided by the same server system 10. Some end users 11 may connect to the server system 10 from the internet 111 through a modem system 112. Some end users 12 may connect to the server system 10 via local servers 121 which may be far away from the server system 10. Some end users 13 may connect to the server system 10 by using hubs 131 which may be located in the same building but different floors of the server system 10. Some end users 14 may connect to the server system 10 through a jack 141 or socket near their working tables. Some end users 15 may use wireless networking devices 151 and wireless hubs 152 to access the server system 10. It is also available or sometimes necessary to connect the server system 10 with another communication system 10a. Most of above mentioned end users require "wires" or "cables" for connection with the server system 10. As a result, the wiring system is concerned. In the wiring system, thousands of wires coming from different locations are gathered and then connected to a distribution frame 20, such like a patch panel stack, before connecting to the server system 10. It is obvious that management of the wires would be a critical issue for such a large wiring system. For example, to identify which jack 211 on the patch panel 21 is connected to which end user located at what remote location. Conventional way to identify wire pairs in the wiring system requires two workers. One worker is stationed at the patch panel stack (distribution frame 20) while the other is stationed at one of the remote end-user locations. The worker at the remote end-user location uses an equipment to generate a test signal to the wires there. The worker at the patch panel stack uses a speaker device and sequentially plugging the speaker device into every jacks on the panels until the speaker device is energized by the test signal and generate a test tone. The wire pair which makes the test tone is then identified and labeled. This process is repeated until all wire pairs are identified. It is obvious that such a conventional wire pair identification method is very laboring and time-wasting. In a large wiring system, it may take days or even weeks to perform wire pair identification.

U.S. Pat. No. 5,847,557 disclosed a method to identify wire pairs in a wiring system. Before starting the wire pair identification, each of the jacks on the patch panel stack (distribution frame) is plugged up with an indicator plug which has a LED inside. By applying a test voltage from a remote end-user location, the indicator plug which connects to that remote end-user location is energized and thus the LED inside is driven to light. As a result, the wire pair is identified. Since workers do not need to sequentially scan every patch panel jacks for each remote end-user location jack manually, time consumption and labor cost are reduced. However, there are still deficiencies for the prior art method disclosed in U.S. Pat. No. 5,847,557. For example, it requires workers to apply lots of indicator plugs to every one of the jacks on the patch panel stack before starting to apply the test voltage, and to remove all of the indicator plugs after the wire pair identification process is completed. Time waste still exists. In addition, it is impossible for U.S. Pat. No. 5,847,557 to directly built-in the LEDs inside the jacks of the patch panel because the LED circuit will incur a short circuit between two contacts of the jack. And, once the patch panel stack is under normal operation such as transmission of communication signals, the LED circuit will result in "loop back shorting" and seriously disrupt the communication. Therefore, it leaves a room for further improvements.

SUMMARY OF THE INVENTION

The primary object of the present invention is to provide a group wiring patching device which has built-in light emitting means and filtering means coupled with wire pair receptacle thereof. When a testing voltage is applied to the circuit of the light emitting means, the light emitting means will emit light for assisting wire pair identification. The filtering means can minimize or even eliminate loop back shorting resulted by the circuit of the connected light emitting means when communication frequency signals or low voltage signals being applied thereto. Therefore, the group wiring patching device of the present invention will be able to perform ordinary signal transmitting functions without the need to remove the light emitting means after the wire pair identification process is done.

Preferably, the filtering means further comprises an artificial wire for diminishing low voltage loop back shorting. The concept of the artificial wire is to provide a sufficient large resistance such that, when a low-frequency signal is generated by a cable stability (or characteristics) tester, the signal passing through the circuit (i.e., passing through the light emitting means and filtering means) becomes very weak and, as a result, the cable stability (or characteristics) tester "thinks" there is no circuit existed at all.

Preferably, the light emitting means comprises two individual LED members connected in parallel but in reverse polarities. Therefore, no matter which direction of current of the DC testing voltage is applied, one of the LED members will be lit. Moreover, the two LED members can be different colors such that, by distinguishing the color of emitted light, it is possible to know if the wires are mis-connected while performing the wire pair identification. In addition, when an AC voltage or other low frequency signals generated by a cable stability (or characteristics) tester are provided to the receptacle, these two LED members may flash in turns so as to identify its status.

The second object of the present invention is to provide a novel cable tester which not only can provide DC testing voltage but also can perform alternative cable stability (or characteristics) tests. The cable tester comprises: a testing voltage supplier, a cable stability (or characteristics) testing module, a controller, an input interface, a display panel and an output. The testing voltage supplier provides DC testing voltage for performing wire pair identification process. The cable stability (or characteristics) testing module contains everything needed for providing the functions of cable stability (or characteristics) tests. The input interface, cable stability (or characteristics) testing module and testing voltage supplier are connected to the controller. By operating (e.g., inputting commands to) the input interface, the controller will switch the connections between the cable stability (or characteristics) testing module and testing voltage supplier, so as to allow either one of these two to send signals (or testing voltage) to the output. In the mean time, the display panel displays the functioning status of the cable tester. The novel cable tester of the present invention will save time for workers to perform wire pair identification and cable stability (or characteristics) tests because they will be able to perform these jobs in one step without the need to re-plug the testers to every one of the receptacles.

DETAILED DESCRIPTION OF THE INVENTION

The primary concept of the present invention is to provide a group wiring patching device which has built-in light emitting means and filtering means coupled with wire pair receptacle thereof. When a testing voltage is applied to the circuit of the light emitting means, the light emitting means will emit light for assisting wire pair identification. The filtering means can minimize or even eliminate loop back shorting resulted by the circuit of the connected light emitting means when communication frequency signals or low voltage signals being applied thereto. Therefore, the group wiring patching device of the present invention will be able to perform ordinary signal transmitting functions without the need to remove the light emitting means after the wire pair identification process is done.

Following are detailed descriptions of some preferred embodiments of the group wiring patching device and the wire pair identification process using the same in accordance with the present invention.

Figure 1:
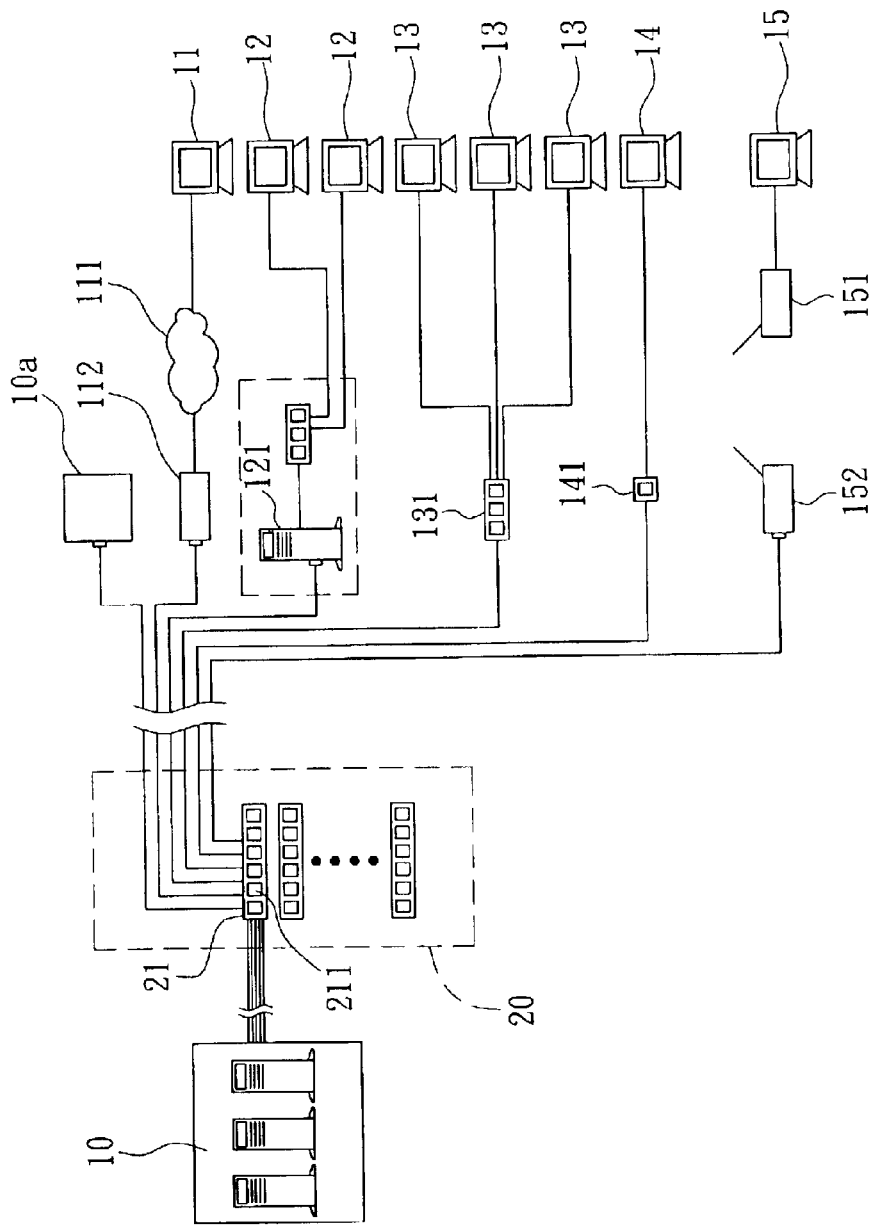
FIG. 1 is a schematic drawing showing a typical example of the relationship between a conventional communication system and end users.
Figure 2:
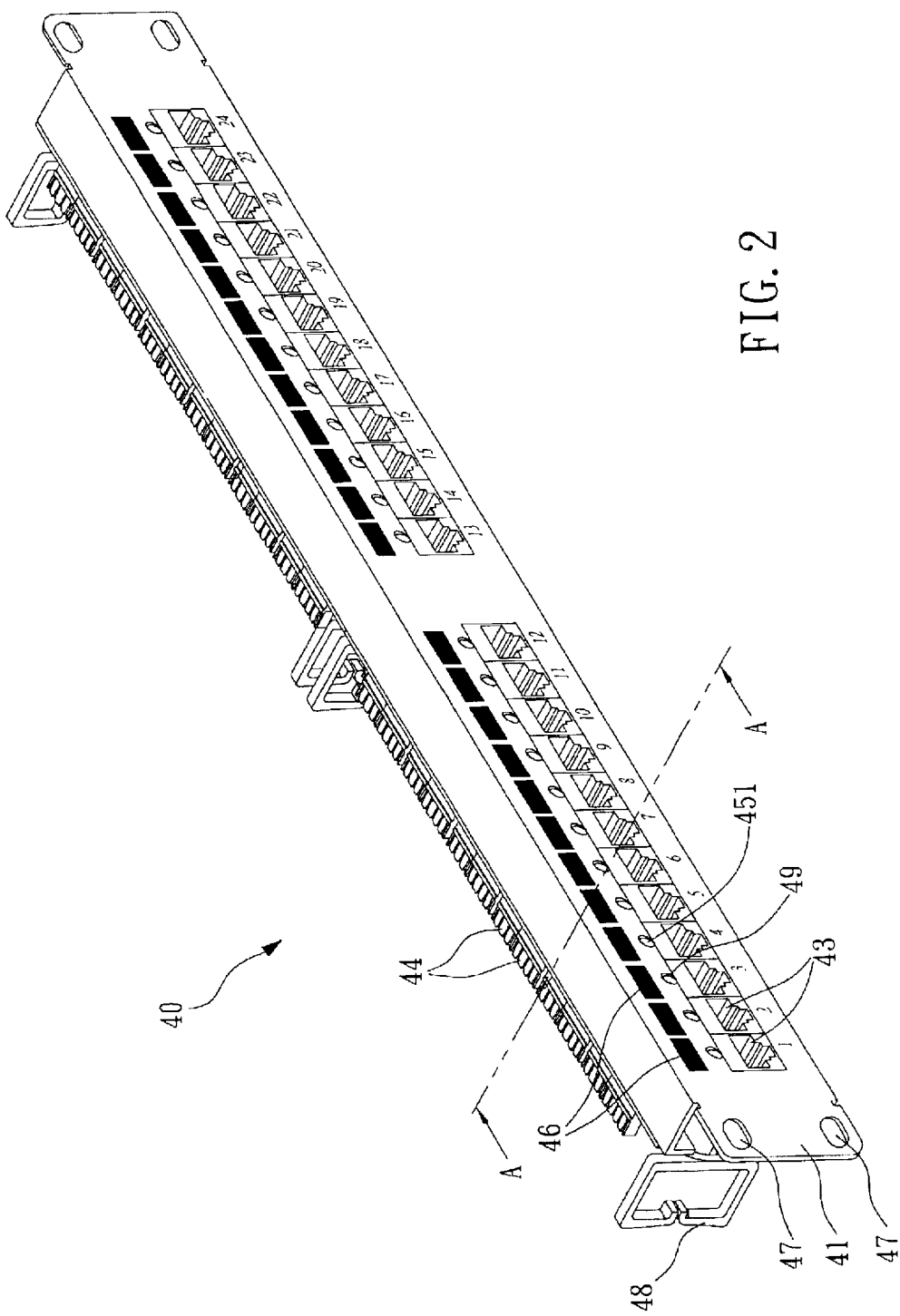
FIG. 2 is a schematically perspective view of a preferred embodiment of the group wiring patching device of the present invention.
Figure 3:
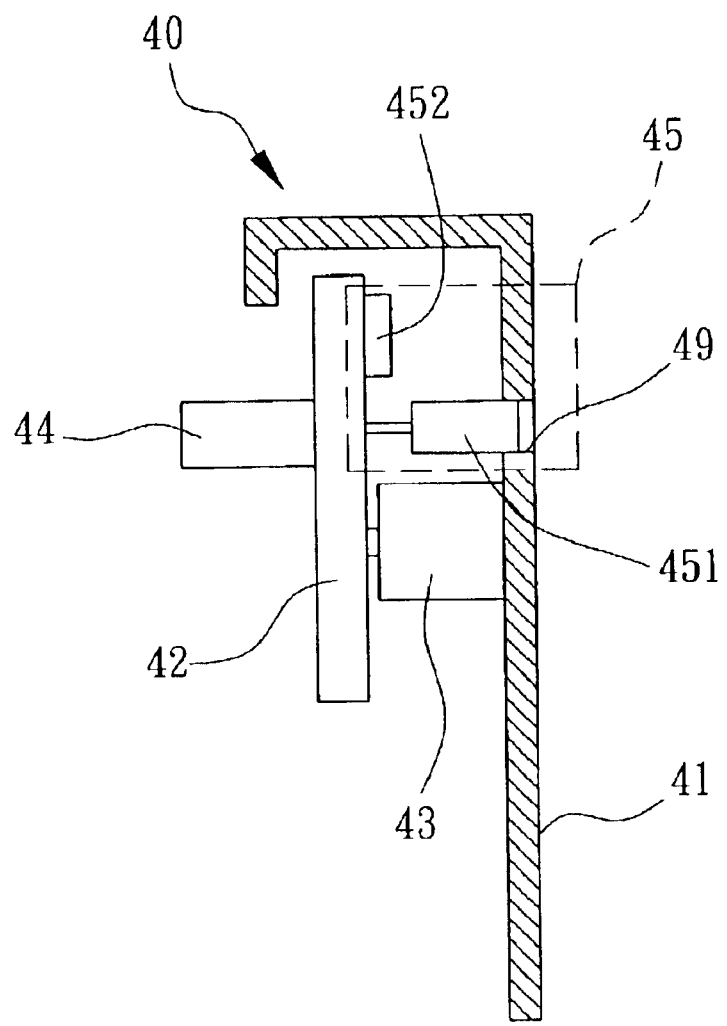
FIG. 3 a schematically A-A section view of FIG. 2.

Please refer to FIG. 2 and FIG. 3, wherein a schematically perspective view and a schematically A—A section view of a preferred embodiment of the group wiring patching device 40 of the present invention are shown. In this preferred embodiment, the group wiring patching device 40 is in a type of patch panel. However, it is obvious to those skilled in the art that it can also be a type choosing from a group comprising: patch panel, wiring termination block, jack-type patch box, block-type patch box, floor outlet, distribution frame (DF), and wiring module.

The group wiring patching device 40 (or also can be referred as patch panel hereafter) comprises a panel 41, a circuit board 42 fixed to the panel, a plurality of jack-typed wire pair receptacles 43 furnished on the panel 41 and connected to the circuit board 42, a plurality of Insulation Displacement Contact (IDC) blocks 44 connected to the circuit board 42 and opposed to the wire pair receptacles 43, and a plurality of testing circuits 45 formed on the circuit board 42 and coupled with the wire pair receptacles 43 respectively. Labeling areas 46 are formed on the front surface of the panel 41 for labeling the wire pair receptacles 43. The panel 41 provides a supporting function for the wire pair receptacles 43 and the circuit board 42. There are some mechanisms such as screw holes 47 and cable management rings 48 for allowing the panel 41 to be fixed to a desired location such like a case, a frame or a rack (not shown in figures).

Each of the wire pair receptacles 43 further comprises at least two contacts (not shown in this figure) each connecting with a conductive wire (not shown in this figure). Each testing circuit 45 is coupled between the conductive wires of a corresponsive wire pair receptacle 43 and is further comprising a light emitting means 451 and a filtering means 452. The light emitting means 451 is able to emit light when a testing voltage being applied to the testing circuit 45. The filtering means 452 is serially coupled with the light emitting means 451 on the testing circuit 45. The filtering means 452 can minimize or even eliminate loop back shorting resulted by the testing circuit 45 when a communication frequency signal or low voltage signals being applied to the contacts. In this preferred embodiment, the light emitting means 451 can be a light emitting diode (LED). The panel 41 is formed with a plurality of holes 49 on a front surface thereof for receiving the light emitting means 451 such that at least part of the light emitted by said light emitting means 451 can be exposed out of the front surface of the panel 41.

In the following description, most elements are the same with or similar to the above mentioned embodiment. Therefore, same elements are provided with same numerals without further descriptions and illustrations.

Figure 4:
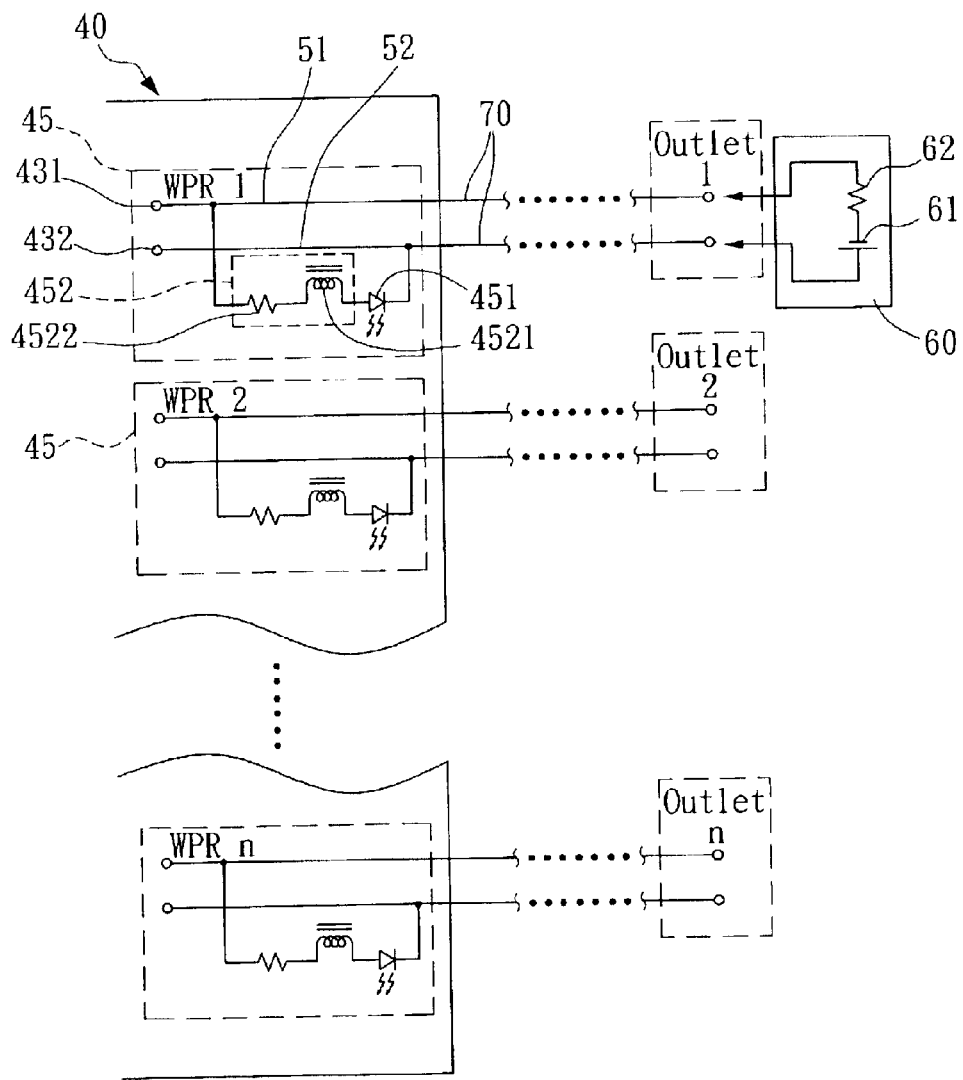
FIG. 4 is a schematic drawing of a preferred embodiment of the testing circuits of the group wiring patching device in co-operation with a cable tester in accordance with the present invention.

FIG. 4 illustrates a first preferred embodiment of the testing circuits 45 of the group wiring patching device 40 in co-operation with a cable tester 60 to perform wire pair identification process. Wherein the symbols WPR1, WPR2 . . . WPRn represent the testing circuits 45 connected with the corresponsive wire pair receptacles 43 (WPR) of the group wiring patching device 40. The symbols Outlet1, Outlet2 . . . Outlet n schematically represent other wire pair receptacles which are located remote from the group wiring patching device 40 and may not be located at same place. These remote wire pair receptacles Outlet1, Outlet2 . . . Outlet n are connected with wire pair receptacles WPR1, WPP2 . . . WPRn by wires or cables 70. It is noted that the remote wire pair receptacles can be jack-typed or plug-typed and may be furnished on a modem system, local server, hub, wall jack, wireless networking device, or another communication system. In the first embodiment shown in FIG. 4, the cable tester 60 includes a DC battery 61 and a resistor 62 and can simply provide a DC testing voltage from one of the remote wire pair receptacles Outlet1, Outlet2 . . . Outlet n.

In this first preferred embodiment of the testing circuit 45 in accordance with the present invention, the testing circuit 45 is coupled between two conductive wires 51,52 of two contacts 431,432 of the wire pair receptacle 43 of the group wiring patching device 40. There is at least one light emitting means 451 (e.g., LED) and at least one filtering means 452 serially connected on the testing circuit 45. One preferred embodiment of the filtering means 452 comprises a low-pass filter 4521 and an artificial wire 4522. Preferably, the low-pass filter 4521 only allows signals having a frequency less than 200 Hz to pass. Therefore, almost all communication frequency signals including telephone signals and computer networking signals will be filtered by the low-pass filter 4521 while some low frequency signals such like AC voltage signals or other testing signals may still pass through it. The artificial wire 4522 is to simulate a very long length of wire (or cable) such that the two contacts 431,432 will not be detected as "short-circuit" when performs some cable stability or characteristics tests. The concept of the artificial wire 4522 is to provide a sufficient large resistance such that, when a low-frequency signal is generated by a cable stability (or characteristics) tester from one of the remote wire pair receptacles, the signal passing through the testing circuit 45 (i.e., passing through the light emitting means 451 and filtering means 452) becomes very weak and, as a result, the cable stability (or characteristics) tester "thinks" there is no testing circuit 45 existed between these two contacts 431,432 at all. Preferably, the artificial wire 4522 can be a resistor having a resistance greater than 400 ohm. However, it is noted that the here-mentioned resistance of the artificial wire 4522 may vary for suiting different kinds of cable stability (or characteristics) testers.

Figure 5:
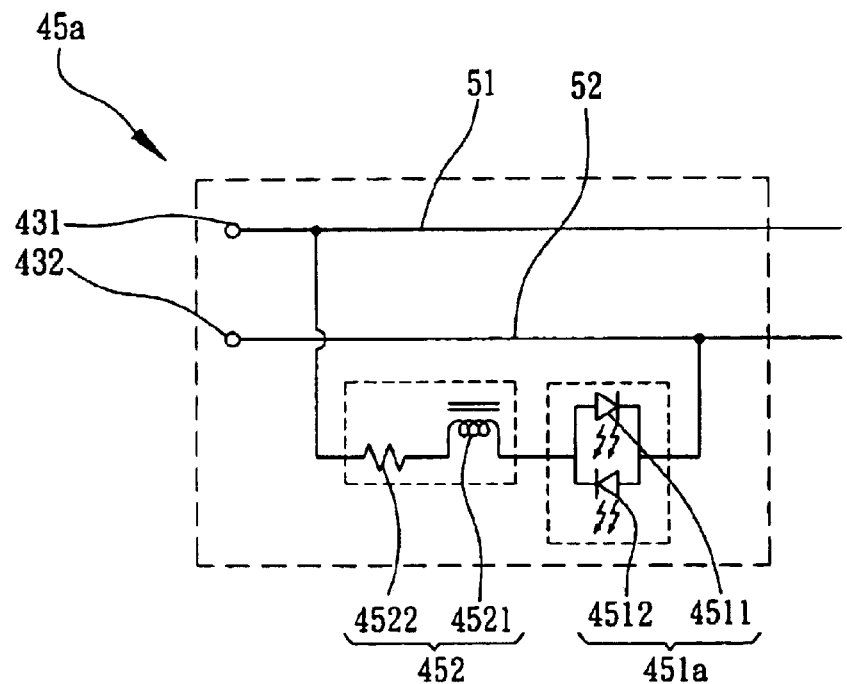
FIG. 5 illustrates a second preferred embodiment of the testing circuit of the group wiring patching device of the present invention.

Referring to FIG. 5, which illustrates a second preferred embodiment of the testing circuit 45a of the group wiring patching device of the present invention. The testing circuit 45a is also coupled between two contacts 431,432 of a wire pair receptacle and also including serially connected light emitting means 451a, low-pass filter 4521 and artificial wire 4522. The only difference between this second preferred embodiment and the one shown in FIG. 4 is that, in the embodiment shown in FIG. 5, the light emitting means 451a comprises two individual LED (light emitting diode) members 4511,4512 connected in parallel but in reverse polarities. Therefore, no matter which direction of current of the DC testing voltage is applied by the cable tester 60, one of the LED members 4511,4512 will be lit. Moreover, the two LED members 4511,4512 can be different colors such that, by distinguishing the color of emitted light, it is possible to know if the wires 51,52 are mis-connected while performing the wire pair identification. In addition, when an AC voltage or other low frequency signals generated by aforesaid cable stability (or characteristics) tester are provided to the contacts 431,432, these two LED members 4511,4512 may flash in turns so as to identify its status (p.s. only if the voltage is large enough to drive the LED members).

Figure 6:
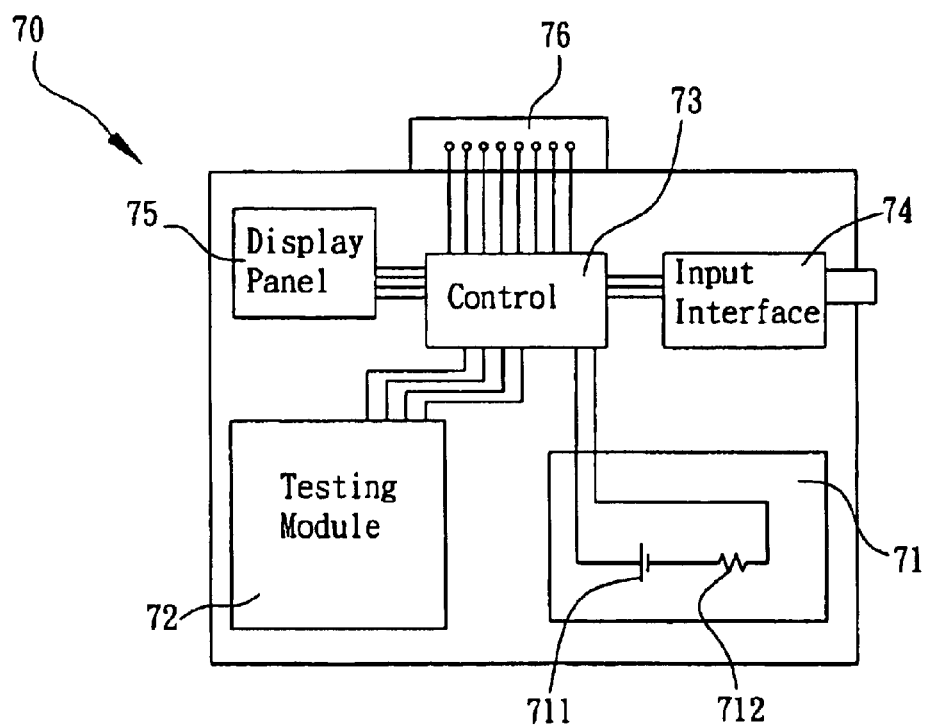
FIG. 6 illustrates another preferred embodiment of the cable tester in accordance with the present invention.

Please refer to FIG. 6, which illustrates another preferred embodiment of the cable tester 70 in accordance with the present invention. Different from the one shown in FIG. 4, the cable tester 70 shown in FIG. 6 not only can provide DC testing voltage but also can perform alternative cable stability (or characteristics) tests. The cable tester 70 comprises: a testing voltage supplier 71, a cable stability (or characteristics) testing module 72, a controller 73, an input interface 74, a display panel 75 and an output 76. The output 76 can be in the form of jack or plug suitable to directly mate with a receptacle or to connect with a cable. The testing voltage supplier 71 at least includes a DC battery 711 and a resistor 712. The testing voltage supplier 71 is to provide DC testing voltage for performing wire pair identification process as previously described. The cable stability (or characteristics) testing module 72 contains everything needed for providing the functions of cable stability (or characteristics) tests. Since such a cable stability (or characteristics) testing module 72 is well-known in the art and may be purchased from the market, no further detailed illustration will be provided. The input interface 74 can be in the type of switches, buttons or keypad. The input interface 74, cable stability (or characteristics) testing module 72 and testing voltage supplier 71 are connected to the controller 73. By operating (e.g., inputting commands to) the input interface 74, the controller 73 will switch the connections between the cable stability (or characteristics) testing module 72 and testing voltage supplier 71, so as to allow either one of these two to send signals (or testing voltage) to the output 76. In the mean time, the display panel 75 displays the functioning status of the cable tester 70. The novel cable tester 70 of the present invention will save time for workers to perform wire pair identification and cable stability (or characteristics) tests because they will be able to perform these jobs in one step without the need to re-plug the testers to every one of the receptacles.

Figure 7:
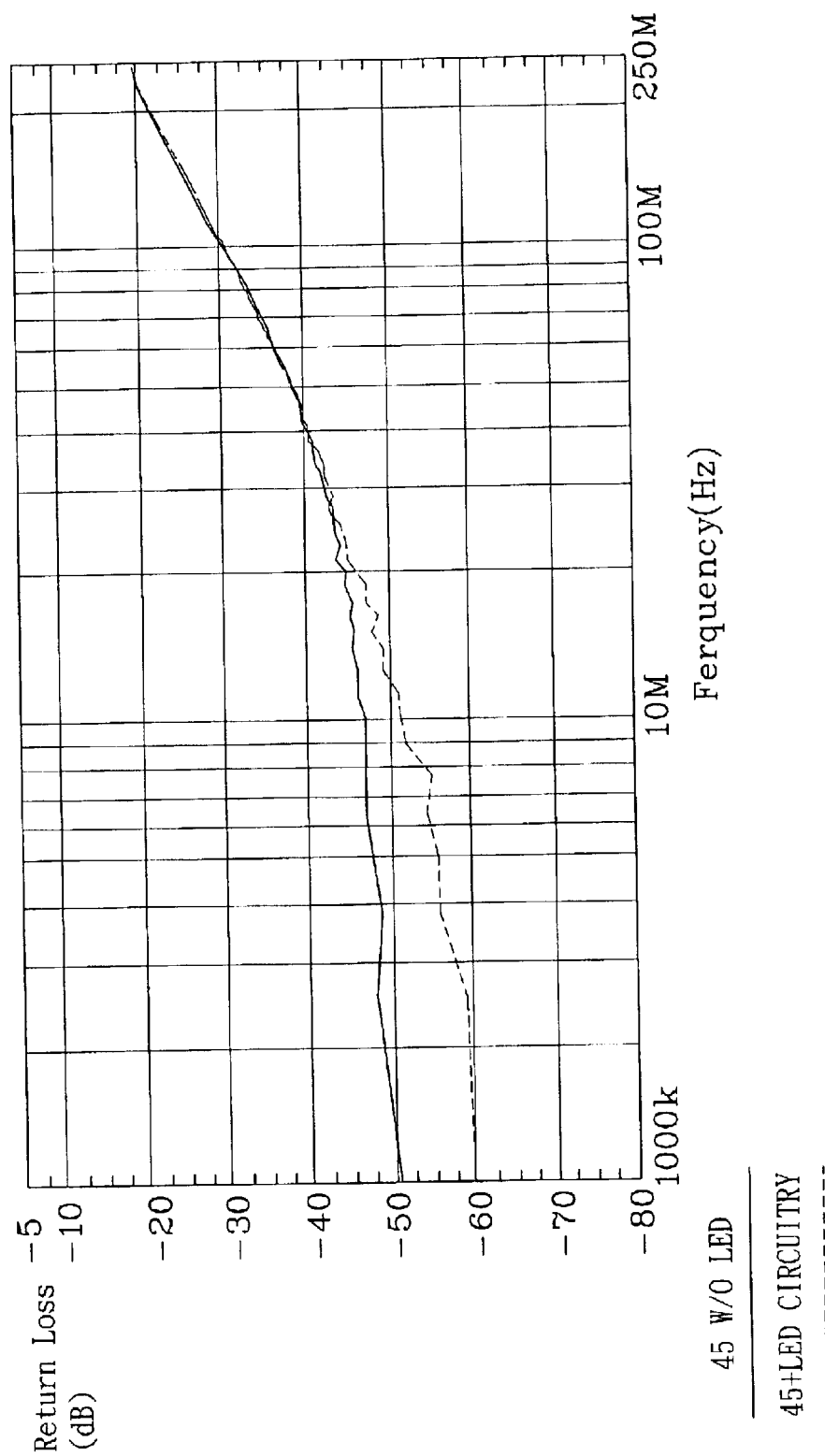
FIG. 7 is a diagram showing the characteristic test result of "Return Loss" test of the present invention.
Figure 8:
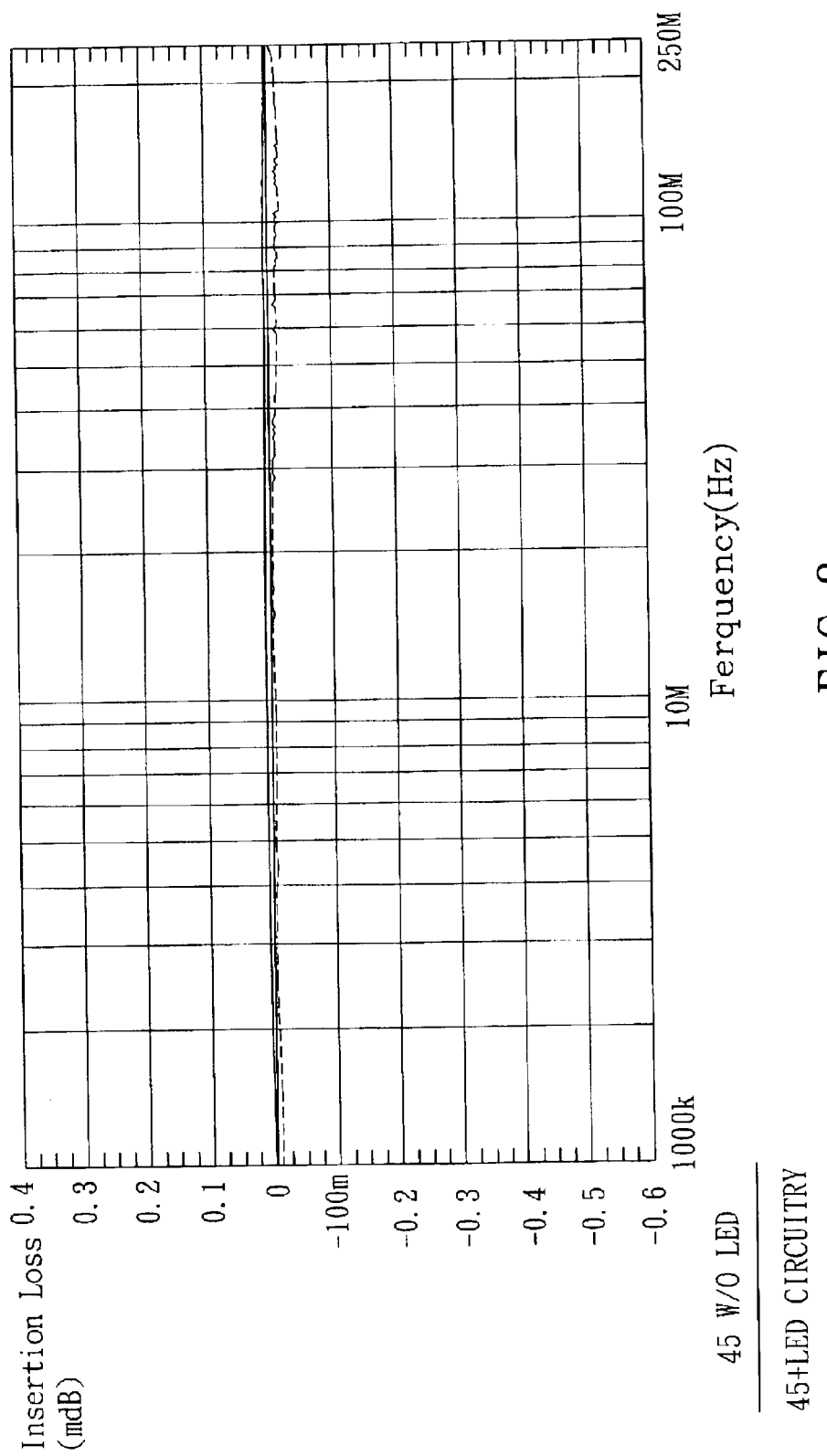
FIG. 8 is a diagram showing the characteristic test result of "Insertion Loss" test of the present invention.
Figure 9:
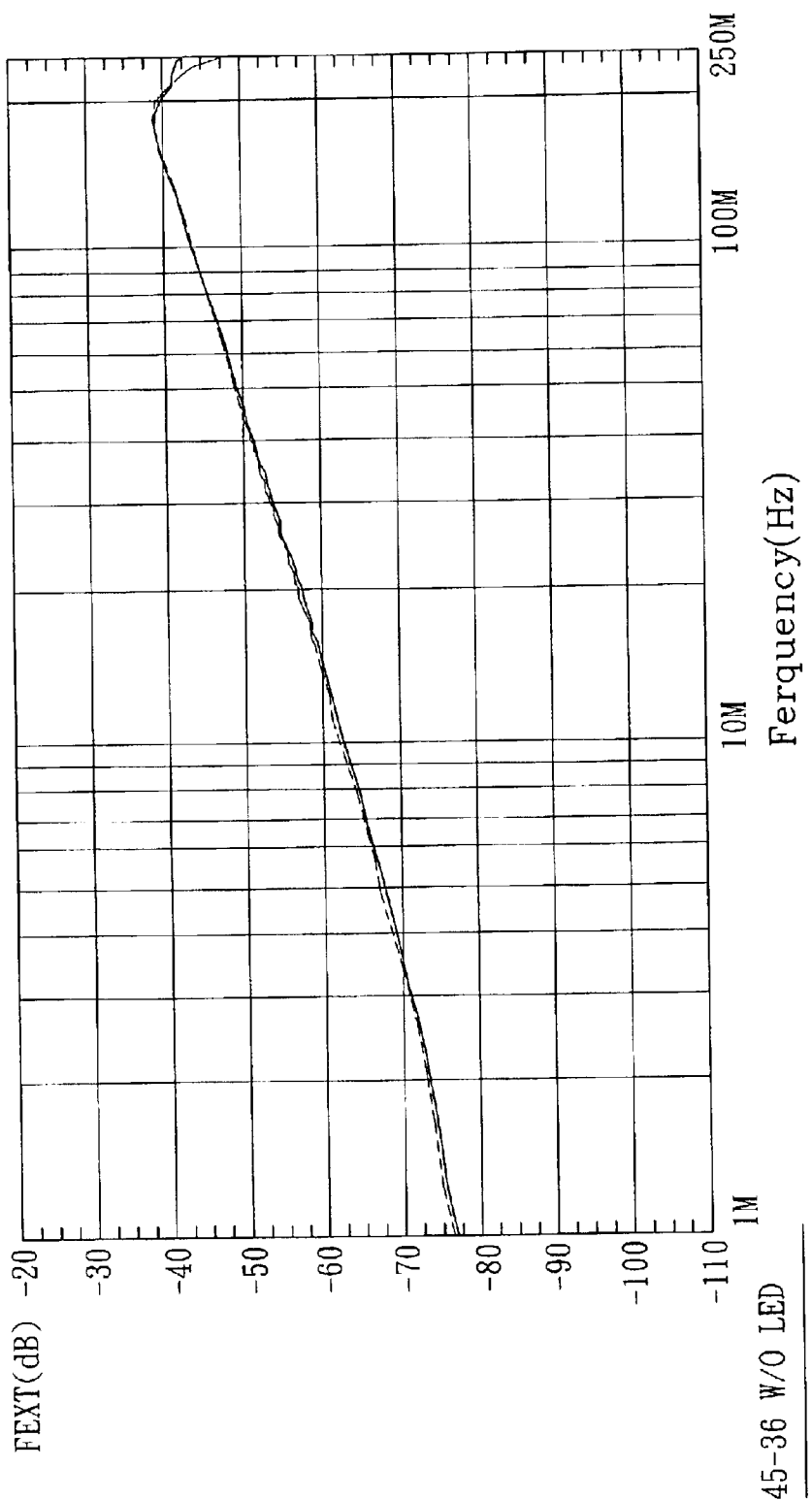
FIG. 9 is a diagram showing the characteristic test result of "Far End Cross Talk (FEXT)" test of the present invention.
Figure 10:
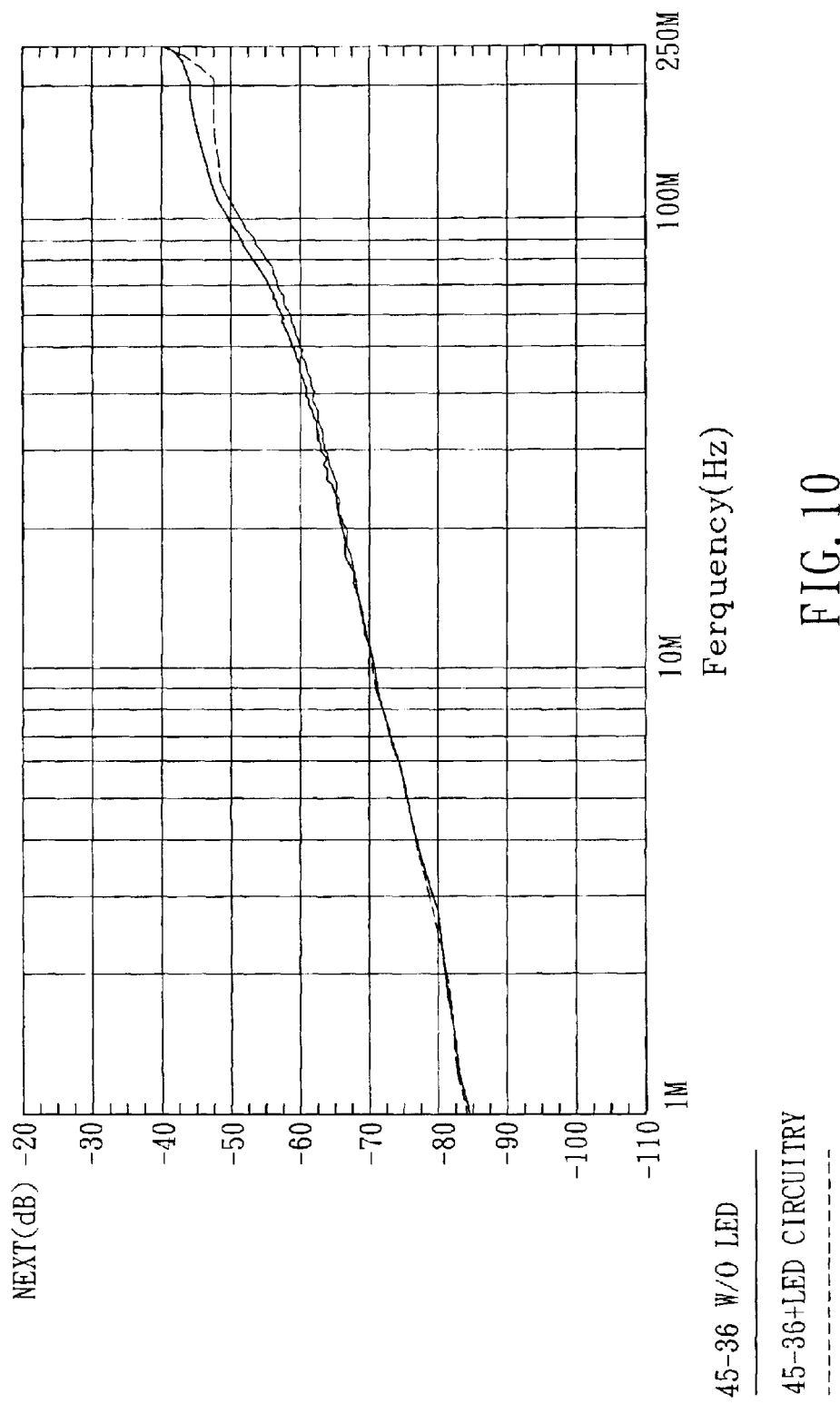
FIG. 10 is a diagram showing the characteristic test result of "Near End Cross Talk (NEXT)" test of the present invention.

Please refer to FIG. 7, FIG. 8, FIG. 9 and FIG. 10. The inventors of the present invention have conducted several characteristics tests to both a conventional patch panel purchased from market and the group wiring patching device 40 of the present invention. Characteristics tests including "Return Loss", "Insertion Loss", "Far End Cross Talk (FEXT)" and "Near End Cross Talk (NEXT)" are performed and the test results are shown in FIG. 7, FIG. 8, FIG. 9 and FIG. 10 respectively. The cable tester used for performing these characteristics tests is a Network Analyzer purchased from the market. The model of the Network Analyzer is "HP-8752C" which was manufactured by Hewlett-Packard Company. The conventional patch panel is not furnished with the testing circuit, LED, nor filtering means. Testing results of the conventional patch panel are represented by solid lines marked with "W/O LED" in the FIG. 7~FIG. 10. The tested group wiring patching device 40 of the present invention is also a patch panel typed device and is furnished with all of the testing circuit 45a, light emitting means 451a and filtering means 452 as shown in FIG. 5. The receptacles furnished on the group wiring patching device 40 of the present invention are RJ-45 jacks having their NO. 4 and NO. 5 pins coupled with the testing circuit 45a for testing. The resistance of the artificial wire 4522 of the tested group wiring patching device 40 is about 21K ohm, while the low-pass filter 4522 here is an inductance with OD-ID-TH=9 mm-5 mm-3 mm toroid and 19 turns. Where OD means "outer diameter", ID means "inner diameter" and TH means "thickness". Testing results of the group wiring patching device 40 of the present invention are represented by broken lines marked with "+LED circuitry" in the FIG. 7~FIG. 10. It can be seen from FIG. 7~FIG. 10 that the communication frequency characteristics of the group wiring patching device 40 of the present invention are almost the same or somehow even better than that of the conventional patch panel without the LED circuit. For example, in the test result of "Return Loss" shown in FIG. 7, the broken line "+LED circuitry" indicates a lower dB value (i.e., less return loss) than the solid line "W/O LED"

when the Frequency is less than 40M Hz approximately. In addition, in the test result of "Near End Cross Talk (NEXT)" shown in FIG. 10, the broken line "+LED circuitry" indicates a lower dB value (i.e., less cross talk) than the solid line "W/O LED" when the Frequency is higher than 20M Hz approximately. In other conditions, as which shown in FIG. 8 and FIG. 9, the dB values of broken line "+LED circuitry" and solid line "W/O LED" are almost the same, which indicate the testing circuit 45a of the group wiring patching device 40 of the present invention will not interfere the characteristics of communication frequency. Moreover, it is suggested that the use of testing circuit 45a and filtering means 452 may be able to decrease Return Loss and Near End Cross Talk within some specific ranges of frequency, and that is why the test results shown in FIG. 7 and FIG. 10 present a better performance for the group wiring patching device 40 of the present invention.

While the present invention has been shown and described with reference to a preferred embodiment thereof, and in terms of the illustrative drawings, it should be not considered as limited thereby. Various possible modifications, omissions, and alterations could be conceived of by one skilled in the art to the form and the content of any particular embodiment without departing from the scope and the spirit of the present invention.

What is claimed is:

1. A group wiring patching device comprising:
   a plurality of wire pair receptacles, each receptacle further comprising at least two contacts each connecting with a conductive wire; and
   a plurality of testing circuits, each testing circuit coupling between said conductive wires of said contacts of one receptacle and further comprising:
   at least one light emitting means coupling with said testing circuit for emitting light when a testing voltage is applied to said testing circuit; and
   a filtering means serially coupling with the light emitting means on the testing circuit for diminishing loop back shorting between said contacts when a communication signal being applied to said contacts, wherein said filtering means further comprises an artificial wire for diminishing low voltage loop back shorting.

2. The group wiring patching device of claim 1, wherein said filtering means further comprises a low-pass filter which can filter signals having a frequency higher than 200 Hz.

3. The group wiring patching device of claim 1, wherein said artificial wire is a resistor having resistance greater than 400 ohm.

4. The group wiring patching device of claim 1, wherein said group wiring patching device further comprises a panel and a circuit board for furnishing said testing circuit, said light emitting means and said filtering means; wherein said panel supports said wire pair receptacles and the circuit board; wherein at least part of light emitted by said light emitting means is exposed out of a front surface of the panel.

5. The group wiring patching device of claim 4, wherein said light emitting means comprises two individual LED members connected in parallel but in reverse polarities.

6. A group wiring patching system for wire pair identification comprising:
   a tester for supplying a testing voltage;
   a group wiring patching device comprising a plurality of wire pair receptacles, each wire pair receptacle having at least two contacts and being coupled with at least one light emitting means and a filtering means, the light emitting means being coupled between said contacts, said filtering means being serially coupled with the light emitting means between said contacts for eliminating loop back shorting between said contacts when communication signals are applied to said contacts;
   at least one local receptacle being located remote from said group wiring patching device, said local receptacles having at least two contacts; and
   means for electrically coupling said contacts of said local receptacles with said contacts of said wire pair receptacles so as to define wire pairs therebetween;
   wherein, said tester supplying said testing voltage to one of the local receptacles causing the light emitting means of the wire pair receptacle which is coupled with that local receptacle to light so as to identify the corresponding wire pair between the local receptacles and the wire pair receptacles, wherein, said filtering means further comprises an artificial wire for diminishing low voltage loop back shorting.

7. The group wiring patching system of claim 6, wherein said light emitting means comprises two individual LED members connected in parallel but in reverse polarities.

8. The group wiring patching system of claim 6, wherein the tester further comprises:
   an output;
   a testing voltage supplier further including a DC battery for properly providing said testing voltage;
   a cable stability/characteristics testing module for providing at least one function of cable stability/characteristics tests;
   an input interface for receiving operating commands of the tester;
   a controller connecting with said output, testing voltage supplier, cable stability/characteristics testing module and input interface; and
   a display panel for displaying functioning status of the tester;
   wherein, by operating the input interface, the controller switches the connections between the cable stability/characteristics testing module and testing voltage supplier so as to allow either one of these two to send signals to the output.

9. A method for identifying wire pairs in a wiring system, said wiring system comprising a plurality of first receptacles and a plurality of second receptacles which are located remote from said first receptacles, each of the second receptacles being connected with only one corresponding first receptacle to form a wire pair therebetween;
   each of said first receptacle further comprising:
   at least two contacts;
   at least one light emitting means coupled between the contacts; and
   a filtering means having a low-pass filter which can filter signals having a frequency higher than 200 Hz and serially coupling with the light emitting means between said contacts for eliminating loop back shorting between said contacts when communication signals are applied to said contacts;
   the method comprising the step of:
   applying a testing voltage to one of the second receptacles to cause the light emitting means of the corresponding first receptacle to light such that the wire pair therebetween is identified;
   wherein, when communication signals are applied to said contacts of the first receptacles, said filtering means eliminates loop back shorting between said contacts such that normal communication operations between said first and second receptacles are not influenced even when the light emitting means are still coupled between said contacts;

wherein said filtering means further comprises a low-pass filter which can filter signals having a frequency higher than 200 Hz.

10. The method of claim 9, wherein said filtering means further comprises an artificial wire for diminishing low voltage loop back shorting.

11. The method of claim 9, wherein said light emitting means comprises two individual LED members connected in parallel but in reverse polarities.

* * * * *